(12) United States Patent
Li

(10) Patent No.: US 10,777,776 B2
(45) Date of Patent: Sep. 15, 2020

(54) FLEXIBLE DISPLAY APPARATUS AND METHOD FOR FABRICATING FLEXIBLE DISPLAY APPARATUS

(71) Applicant: Wuhan China Star Optoelectronics Semiconductor Display Technology Co., Ltd., Wuhan, Hubei (CN)

(72) Inventor: Bo Li, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 49 days.

(21) Appl. No.: 15/744,784

(22) PCT Filed: Nov. 30, 2017

(86) PCT No.: PCT/CN2017/114019
§ 371 (c)(1),
(2) Date: Jan. 13, 2018

(87) PCT Pub. No.: WO2019/090867
PCT Pub. Date: May 16, 2019

(65) Prior Publication Data
US 2019/0148679 A1     May 16, 2019

(30) Foreign Application Priority Data
Nov. 10, 2017   (CN) .......................... 2017 1 1104667

(51) Int. Cl.
*H01L 51/56* (2006.01)
*G09F 9/30* (2006.01)
(Continued)

(52) U.S. Cl.
CPC .............. *H01L 51/56* (2013.01); *G09F 9/301* (2013.01); *H01L 51/0097* (2013.01);
(Continued)

(58) Field of Classification Search
None
See application file for complete search history.

(56) References Cited

U.S. PATENT DOCUMENTS

| 6,380,497 B1* | 4/2002 | Hashimoto | ............. G06F 3/045 200/5 A |
| 9,950,505 B2* | 4/2018 | Qiao | .................... H01L 51/0097 |
| 2012/0106122 A1* | 5/2012 | Ryu | ................... G02F 1/133608 362/19 |

FOREIGN PATENT DOCUMENTS

| CN | 103336604 A | 10/2013 |
| CN | 104637886 A | 5/2015 |

(Continued)

*Primary Examiner* — Kenneth B Lee, Jr.
(74) *Attorney, Agent, or Firm* — Hemisphere Law, PLLC; Zhigang Ma

(57) ABSTRACT

A flexible display apparatus and a fabricating method thereof are provided. The flexible display apparatus comprises a first substrate and a first optical clear adhesive layer. The first optical clear adhesive layer is disposed on one side of the first substrate. The first optical clear adhesive layer has a pair of transparent spacers. The transparent spacers are applied to divide the first optical clear adhesive layer into a first part and a second part. The first part is located between the pair of the transparent spacers, and the second part is located at outside of the pair of the transparent spacers. A thickness of the first part is smaller than a thickness of the second part. A vertical projection of the first part on the first substrate is forming a first area. When the flexible display apparatus is in a folding state, the first area is bent.

7 Claims, 5 Drawing Sheets

(51) Int. Cl.
  *H01L 51/52* (2006.01)
  *H01L 51/00* (2006.01)
  *H01L 27/32* (2006.01)
(52) U.S. Cl.
  CPC .......... *H01L 51/525* (2013.01); *H01L 27/323* (2013.01); *H01L 27/3244* (2013.01); *H01L 2251/5338* (2013.01)

(56) References Cited

FOREIGN PATENT DOCUMENTS

| | | |
|---|---|---|
| CN | 106129082 A | 11/2016 |
| CN | 205845421 U | 12/2016 |
| CN | 106354290 A | 1/2017 |
| CN | 205862310 U | 1/2017 |
| CN | 107180595 A | 9/2017 |
| CN | 107230429 A | 10/2017 |
| CN | 107274793 A | 10/2017 |
| CN | 107331795 A | 11/2017 |
| WO | 2017112438 A1 | 6/2017 |

* cited by examiner

FLEXIBLE DISPLAY APPARATUS AND METHOD FOR FABRICATING FLEXIBLE DISPLAY APPARATUS

RELATED APPLICATIONS

The present application is a National Phase of International Application Number PCT/CN2017/114019, filed Nov. 30, 2017, and claims the priority of China Application No. 201711104667.6, filed Nov. 10, 2017.

FIELD OF THE DISCLOSURE

The disclosure relates to a display technical field, and more particularly to a flexible display apparatus and a method for fabricating a flexible display apparatus.

BACKGROUND

For the past few years, the fast developments of Organic Light-Emitting Diode (OLED) drive the products with curved and flexible touch panel entering the markets rapidly. The major panel manufacturers invested a great amount of capital in developing the flexible touch panels. Different layers of the touch panels are fastened to each other with the optical clear adhesive (OCA). However, the optical clear adhesive is a glue material easy to occur deformation. For the flexible display apparatus, the product needs to be folded and spread frequently. The optical clear adhesive would be squeezed and deform when the product is operated form the spreading state to the folding state, and the optical clear adhesive would undergo from the former extruding state to the stretching state when the product is operated form the folding state to the spreading state. But the rough recovery of the optical clear adhesive to the original state before folding the product needs few hours, therefore is not satisfying the demand of the flexible displays.

Because the larger thickness of the optical clear adhesive the longer the recovery time for the squeezing deformation, the current solution is to reduce the thickness of the optical clear adhesive. However, the thinner optical clear adhesive could not fill effectively the thickness difference between different laminates, and has the risk of occurring bubbles.

SUMMARY

For solving the above issue, the present invention provides a flexible display apparatus and a fabricating method thereof, to solve the issue of long recovery time after the deformation of folding and spreading the optical clear adhesive of the flexible display apparatus in current technology.

For solving the above issue, a flexible display apparatus provided by the present invention comprises a first substrate and a first optical clear adhesive layer disposed on one side of the first substrate. The first optical clear adhesive layer has a pair of transparent spacers, and the transparent spacers are applied to divide the first optical clear adhesive layer into a first part and a second part. The first part is located between the pair of the transparent spacers, the second part is located at outside of the pair of the transparent spacers. A thickness of the first part is smaller than a thickness of the second part. A vertical projection of the first part on the first substrate is forming a first area. When the flexible display apparatus is in a folding state, the first area is bent.

In an embodiment, the transparent spacers are disposed in a same direction.

In an embodiment, the pair of the transparent spacers is disposed vertically on the first substrate.

In an embodiment, a midline of two the second parts is through the first area, and the pair of the transparent spacers is disposed symmetrically at two sides of the midline.

In an embodiment, the flexible display apparatus further comprises a second substrate disposed on one side of the first optical clear adhesive layer far away the first substrate, the second substrate adhered to the first substrate with the first optical clear adhesive layer.

In an embodiment, the flexible display apparatus further comprises a cover, disposed on one side of the second substrate far away the first substrate, and a second optical clear adhesive layer disposed between the cover and the second substrate, the cover adhered to the second substrate with the second optical clear adhesive layer.

In an embodiment, the flexible display apparatus further comprises a second substrate and a polarizer, the second substrate disposed between the first substrate and the first optical clear adhesive layer, the polarizer disposed on one side of the first optical clear adhesive layer far away the second substrate, the polarizer adhered to the second substrate with the first optical clear adhesive layer.

In an embodiment, the flexible display apparatus further comprises a cover, disposed on one side of the polarizer far away the second substrate, and a third optical clear adhesive layer, disposed between the cover and the second substrate, the cover adhered to the second substrate with the third optical clear adhesive layer.

In an embodiment, a midline of two the second parts is through the first area, and the pair of the transparent spacers are disposed symmetrically at two sides of the midline.

In an embodiment, the flexible display apparatus further comprises a second substrate, disposed on one side of the first optical clear adhesive layer far away the first substrate, the second substrate adhered to the first substrate with the first optical clear adhesive layer.

In an embodiment, the flexible display apparatus further comprises a cover, disposed on one side of the second substrate far away the first substrate, and a second optical clear adhesive layer disposed between the cover and the second substrate, the cover adhered to the second substrate with the second optical clear adhesive layer.

In an embodiment, the flexible display apparatus further comprises a second substrate and a polarizer, the second substrate disposed between the first substrate and the first optical clear adhesive layer, the polarizer disposed on one side of the first optical clear adhesive layer far away the second substrate, the polarizer adhered to the second substrate with the first optical clear adhesive layer.

In an embodiment, the flexible display apparatus further comprises a cover, disposed on one side of the polarizer far away the second substrate, and a third optical clear adhesive layer disposed between the cover and the second substrate, the cover adhered to the second substrate with the third optical clear adhesive layer.

The present invention also provides a method for fabricating a flexible display apparatus, the method comprises providing a first substrate, and forming a pair of transparent spacers on the first substrate; spraying liquid optical clear adhesive on the first substrate to form a first optical clear adhesive layer, wherein the transparent spacers are applied to divide the first optical clear adhesive layer into a first part and a second part, the first part is located between the pair of the transparent spacers, the second part is located at outside of the pair of the transparent spacers, a thickness of the first part is smaller than a thickness of the second part, a vertical projection of the first part on the first substrate is forming a first area, when the flexible display apparatus is in a folding state, the first area is bent; and adhering a second substrate to the first substrate with the first optical clear adhesive layer.

In an embodiment, the liquid optical clear adhesive is sprayed on the first substrate by an inkjet printing process.

In an embodiment, the transparent spacers are disposed in a same direction.

In an embodiment, the pair of the transparent spacers is disposed vertically on the first substrate.

In an embodiment, a midline of two the second parts is through the first area, and the pair of the transparent spacers is disposed symmetrically at two sides of the midline.

In an embodiment, the flexible display apparatus further comprises a second substrate disposed on one side of the first optical clear adhesive layer far away the first substrate, the second substrate adhered to the first substrate with the first optical clear adhesive layer.

In an embodiment, the flexible display apparatus further comprises a cover, disposed on one side of the second substrate far away the first substrate, and a second optical clear adhesive layer disposed between the cover and the second substrate, the cover adhered to the second substrate with the second optical clear adhesive layer.

The present invention has following advantages. The first area is corresponding to the deformation area of the flexible display apparatus when the flexible display apparatus being folded from a spreading state or being spread from a folding state. The first part of the first optical clear adhesive layer is corresponding to the first area of the flexible display apparatus. The thickness of the first part is smaller to prevent from accumulation of stress when the flexible display apparatus being operated from one of the spreading state and the folding state to another. The recovery of the deformation of the first part would be fast and satisfy the demand of the flexible display apparatus. The affect of folding deformation to the second part is small, so the thickness of the second part is larger to satisfy the demand of adhering devices for adhering firmly and avoiding of bubbles occurring, and thereby favorable for realizing the flexible display apparatus.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

In order to understand the above objectives, features and advantages of the present disclosure more clearly, the present disclosure is described in detail below with references to the accompanying drawings and specific embodiments.

Figure 1:
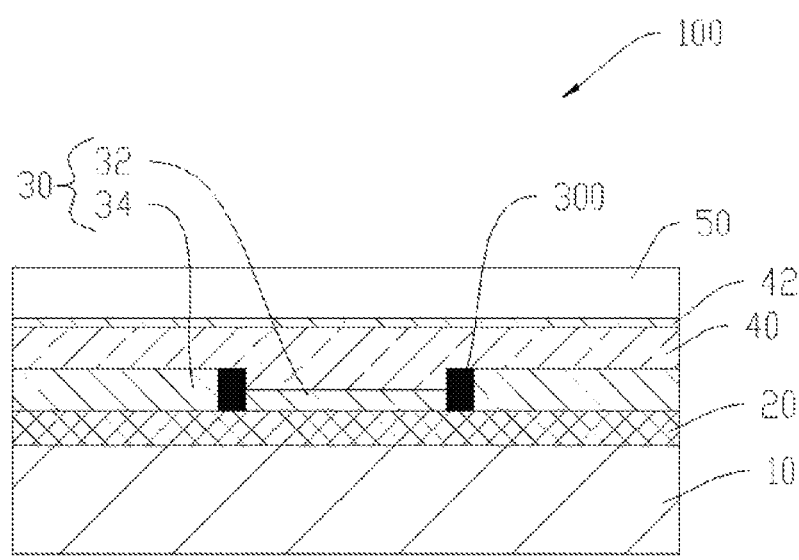
FIG. 1 is a structural schematic view of a flexible display apparatus according to a first embodiment of the disclosure.
Figure 2:
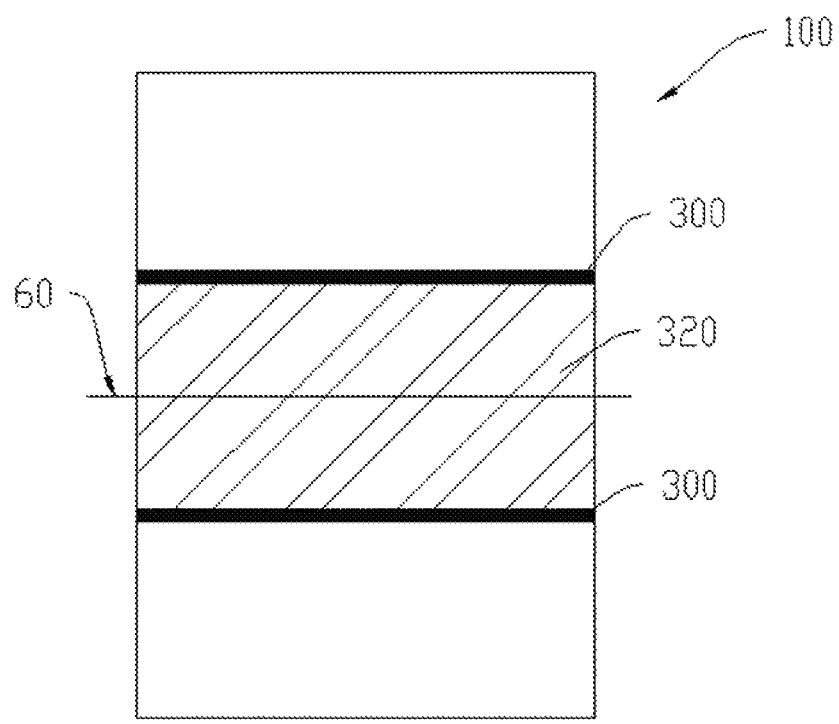
FIG. 2 is a top view of the flexible display apparatus according to the first embodiment of the disclosure.
Figure 3:
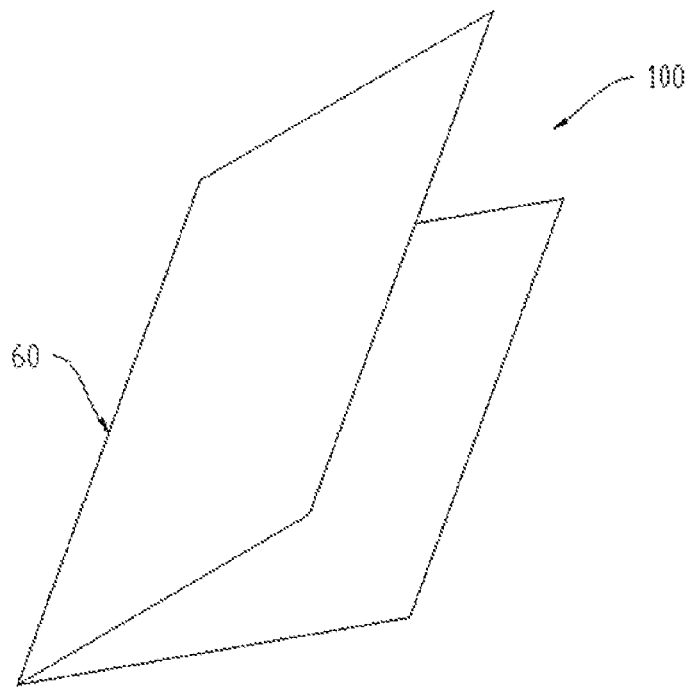
FIG. 3 is a structural schematic view for illustrating the flexible display apparatus being in a folding state according to the first embodiment of the disclosure.

Please refer to FIG. 1, FIG. 2 and FIG. 3, a flexible display apparatus 100 provided in a first embodiment of the present invention is illustrated. In specific, as shown in FIG. 3, the flexible display apparatus 100 is folded at the position corresponding to a first area 320, and a line made by folding is formed along a midline 60 of the first area 320 after the flexible display apparatus 100 is folded.

In specific, as shown in FIG. 1, the flexible display apparatus 100 comprises a first substrate, a second substrate, a first optical clear adhesive layer 30 and a polarizer 40. In this embodiment, the first substrate is a touch panel 20, the second substrate is the polarizer 40. In one embodiment, the display panel 10 is an active-matrix organic light emitting diode (AMOLED) display panel 10. The AMOLED display panel 10 has high image sharpness and is suitable for the flexible display apparatus 100. In other embodiments, other flexible display panels may be chosen to be the display panel 10. The touch panel 20 is applied for realizing the function of touch and control. In this embodiment, the touch panel 20 may be the capacitive touch panel formed by one layer or two layers conducting layers, and the touch panel 20 is also flexible. The touch panel 20 is disposed at the side of the displaying plane of the display panel 10. In one embodiment, the touch panel is adhered to the displaying plane of the display panel 10, or the touch panel 20 is embedded on the display panel 10.

In this embodiment, the first optical clear adhesive layer 30 is applied to adhere the touch panel 20 and the polarizer 40. In specific, the first optical clear adhesive layer 30 is disposed on one side of the touch panel 20 far away the display panel 10, namely the touching plane of the touch panel 20. The first optical clear adhesive layer 30 has a pair of transparent spacers 300. As shown in FIG. 1 and FIG. 2, in this embodiment, the transparent spacers 300 are applied to divide the first optical clear adhesive layer 30 into a first part 32 and a second part 34. The vertical projection of the first part 32 on the display panel 10 is forming a first area 320. When the flexible display apparatus 100 is in the folding state, the first area 320 is bent. Also referring to FIG. 2, the midline 60 of the first area 320 is located between a pair of the transparent spacers 300, and between two the second part 34. Further, the area formed between a pair of the transparent spacers 300 covers at least the first area 320. When the flexible display apparatus 100 has an even thickness, the first area 320 is distributed symmetrically along the midline 60. A pair of the transparent spacers 300 is disposed symmetrically at two sides of the midline 60, and the pair of the transparent spacers 300 is distributed symmetrically along the midline 60. In one embodiment, the transparent spacers 300 are formed of non-conductive transparent materials. The transparent spacers 300 would not affect the displaying of the display panel 10, and the insulating spacers would not affect the touching function of the touch panel 20. In one embodiment, the transparent spacers 300 is formed by an inkjet printing process. The thickness of the transparent spacers 300 is about 3~20 µm. The first part 32 is located between the pair of the transparent spacers 300, namely the first part 32 covers at least the first area 320. The second part 34 is located at outside of the pair of the transparent spacers 300. In specific, the second part 34 is distributed from the transparent spacer 300 to the edge of the flexible display apparatus 100. In this embodiment, the thickness of the first part 32 is smaller than the thickness of the second part 34. In other words, the thickness of the first optical clear adhesive layer 30 corresponding to the first area 320 is smaller than the thickness of the first optical clear adhesive layer 30 distributed at outside of the first area 320. When the flexible display apparatus 100 is folded, the first optical clear adhesive layer 30 at the first area 320 would deform. The thickness of the first optical clear adhesive layer 30 is small, the recovery of deformation is faster. The thickness of the first optical clear adhesive layer 30 is larger, the viscosity is better, and the layers adhered thereon are not easily detached. The first part 32 of the first optical clear adhesive layer 30 is corresponding to the first area 320, and the second part 34 is corresponding to the areas outside of the first area 320. The thickness of the first part 32 is smaller than the thickness of the second part 34. The thickness of the first part 32 is smaller, the recovery of deformation is faster, which is satisfying the folding demand of the flexible display apparatus 100. The thickness of the second part 34 is larger, the viscosity is better. The affect of folding deformation to the second part 34 is small, and the viscosity is enough to fasten firmly the polarizer 40 and the touch panel 20. In this embodiment, the polarizer 40 is adhered on the touch panel 20 with the first optical clear adhesive layer 30. The polarizer 40 is applied to filter ambient light irradiated on the display panel 10 for preventing the actual displaying image of the display panel 10 from the influences of the reflected light of ambient light by the display panel 10 mixing with the light emitted from the display panel 10. In one embodiment, the polarizer 40 is a circular polarizer 40.

Corresponding to the first area 320 is the deformed area of the flexible display apparatus 100 affected by folding when the flexible display apparatus 100 being operated from one of the spreading state and the folding state to another. The first part 32 of the first optical clear adhesive layer 30 is corresponding to the position of the first area 320 of the flexible display apparatus 100. The thickness of the first part 32 is smaller to prevent from accumulation of stress when the flexible display apparatus 100 being operated from one of the spreading state and the folding state to another. The recovery of the deformation of the first part 32 would be fast and satisfy the demand for folding of the flexible display apparatus 100. The affect of folding deformation to the second part 34 is small, so the thickness of the second part 34 is larger to satisfy the demand for adhering to adhere devices firmly and avoid of bubbles occurring, and thereby favorable for realizing the flexible display apparatus.

Please refer to FIG. 2, in this embodiment, the transparent spacers 300 are disposed in a same direction. When the flexible display apparatus 100 is folded, the affect areas distributed at two sides of the line made by folding are symmetrical. When the transparent spacers 300 are parallel to each other, the distances from each the transparent spacer 300 to the line made by folding are same or symmetrical. The covering areas of affect areas of the first part 32 by folding at two sides of the line made by folding are same. In other words, half the first part 32 is corresponding to half the affect area by folding (the first area 320), thereby to have the affect at two sides after bending the flexible display apparatus 100 are symmetrical. In one embodiment, the direction of a pair of the transparent spacers 300 is same as the direction of the midline 60, namely the line made by folding, of the first area 320. The directions of the transparent spacers 300 same as the direction of the midline 60 means the extending directions of the transparent spacers 300 are parallel to the edges of the first area 320. The area between the pair of the transparent spacers 300 covers the first area 320. The distances between the transparent spacer 300 and the edge of the first area 320 are same. Further, the distributing directions of the transparent spacers 300 are same as the extending direction of the midline 60. The transparent spacers 300 are parallel to the midline 60 of the flexible display apparatus 100. The transparent spacers 300 would not affect the folding of the first area 320, thereby to promote the folding effect. In this embodiment, two the transparent spacers 300 are disposed at two sides of the midline 60 symmetrically. When the flexible display apparatus 100 is folded, two portions of the first part 32 covering the first optical clear adhesive layer 30 at two sides of the midline 60 are same. The folding deformations to two sides of the first optical clear adhesive layer 30 are symmetrical, thereby favorable for the recovery of the deformation of the first optical clear adhesive layer 30.

Please refer to FIG. 1, in this embodiment, the flexible display apparatus 100 further comprises a cover 50. The cover 50 is disposed on one side of the polarizer 40 far away the touch panel 20. The cover 50 is adhered to the polarizer 40 with an optical clear adhesive 42, for protecting the polarizer 40, the touch panel 20, etc. In this embodiment, the cover 50 is a flexible transparent cover 50, such as plastic material. The cover 50 has the feature of being flexible.

Corresponding to the first area 320 is the deformed area of the flexible display apparatus 100 affected by folding when the flexible display apparatus 100 being operated from one of the spreading state and the folding state to another. The first part 32 of the first optical clear adhesive layer 30 is corresponding to the position of the first area 320 of the flexible display apparatus 100. The thickness of the first part 32 is smaller to prevent from accumulation of stress when the flexible display apparatus 100 being operated from one of the spreading state and the folding state to another. The recovery of the deformation of the first part 32 would be fast and satisfy the demand for folding of the flexible display apparatus 100. The affect of folding deformation to the second part 34 is small, so the thickness of the second part 34 is larger to satisfy the demand for adhering to adhere devices firmly and avoid of bubbles occurring, and thereby favorable for realizing the flexible display apparatus.

Figure 4:
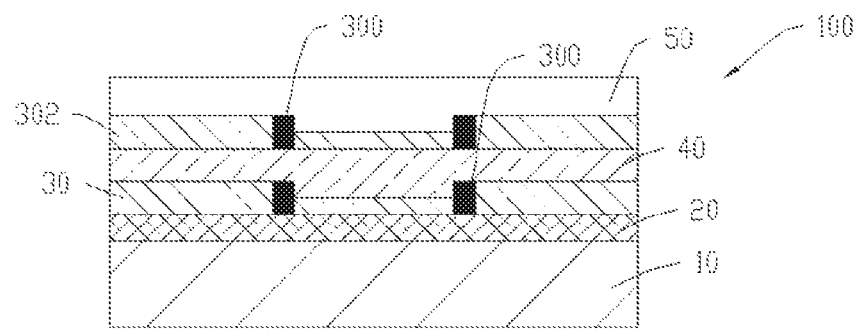
FIG. 4 is a structural schematic view of a flexible display apparatus according to a second embodiment of the disclosure.

Please refer to FIG. 4, the difference between the flexible display apparatus 100 provided in the second embodiment of the present invention and the flexible display apparatus in the first embodiment is a second optical clear adhesive layer 302 disposed between the cover 50 and the polarizer 40. The cover 50 is adhered to the polarizer 40 with the second optical clear adhesive layer 302. In specific, the first optical clear adhesive layer 30 and the second optical clear adhesive layer 302 are same. In other words, the second optical clear adhesive layer 302 is also divided by a pair of transparent spacers 300 into a first part 32 and a second part 34. The thickness of the first part 32 is smaller than the thickness of the second part 34. In this embodiment, the first part 32 between the cover 50 and the polarizer 40 is corresponding to the first part 32 between the touch panel 20 and the polarizer 40. Also referring to FIG. 2, corresponding to the first area 320 is the deformed area of the flexible display apparatus 100 affected by folding when the flexible display apparatus 100 being operated from one of the spreading state and the folding state to another. The first part 32 of the second optical clear adhesive layer 302 is corresponding to the position of the first area 320 of the flexible display apparatus 100. The thickness of the first part 32 is smaller to prevent from accumulation of stress when the flexible display apparatus 100 being operated from one of the spreading state and the folding state to another. The recovery of the deformation of the first part 32 would be fast and satisfy the demand for folding of the flexible display apparatus 100. The affect of folding deformation to the second part 34 is small, so the thickness of the second part 34 is larger to satisfy the demand for adhering to adhere devices firmly and avoid of bubbles occurring, and thereby favorable for realizing the flexible display apparatus.

Figure 5:
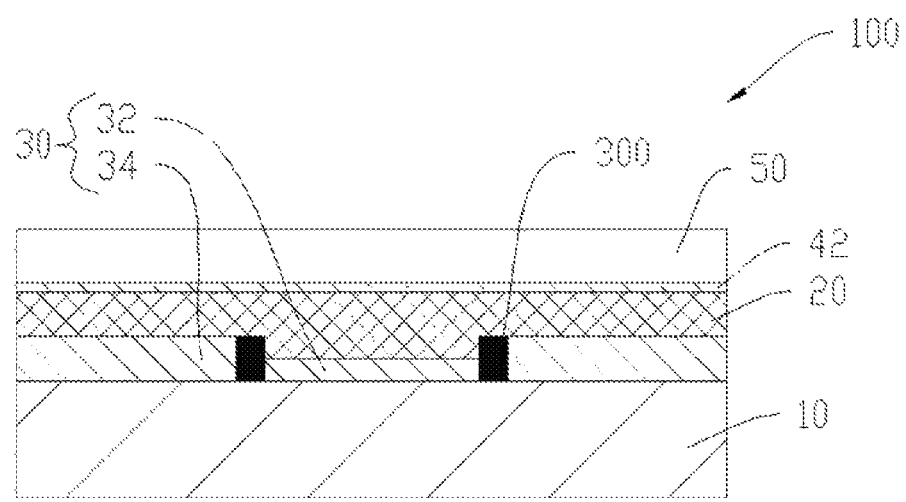
FIG. 5 is a structural schematic view of a flexible display apparatus according to a third embodiment of the disclosure.

Please refer to FIG. 5, the flexible display apparatus 100 provided in the third embodiment of the present invention comprises the display panel 10, the first optical clear adhesive layer 30 and the touch panel 20. In this embodiment, the first substrate is the display panel 10, the second substrate is the touch panel 20. The first optical clear adhesive layer 30 is disposed on the display panel 10. The first optical clear adhesive layer 30 has a pair of transparent spacers 300. Also referring to FIG. 2, in this embodiment, the transparent spacers 300 is applied to divide the first optical clear adhesive layer 30 into a first part 32 and a second part 34. The vertical projection of the first part 32 on the display panel 10 is forming a first area 320. When the flexible display apparatus 100 is in the folding state, the first area 320 is bent. The midline 60 of the first area 320 is located between a pair of the transparent spacers 300. Further, the area formed between a pair of the transparent spacers 300 covers at least the first area 320. When the flexible display apparatus 100 has an even thickness, the first area 320 is distributed symmetrically along the midline 60. In other words, a pair of the transparent spacers 300 is disposed symmetrically at two sides of the midline 60, the pair of the transparent spacers 300 is distributed symmetrically along the midline 60. In one embodiment, the transparent spacers 300 are formed of non-conductive transparent materials. The transparent spacers 300 would not affect the displaying of the display panel 10, and the insulating spacers would not affect the touching function of the touch panel 20. In one embodiment, the transparent spacers 300 is formed by an inkjet printing process. The thickness of the transparent spacers 300 is about 3~20 µm. The first part 32 is located between a pair of the transparent spacers 300, namely the first part 32 covers at least the first area 320. The second part 34 is located at outside of a pair of the transparent spacers 300. In specific, the second part 34 is distributed from the transparent spacer 300 to the edge of the flexible display apparatus 100. In this embodiment, the thickness of the first part 32 is smaller than the thickness of the second part 34. In other words, the thickness of the first optical clear adhesive layer 30 corresponding to the first area 320 is smaller than the thickness of the first optical clear adhesive layer 30 distributed at outside of the first area 320. When the flexible display apparatus 100 is folded, the first optical clear adhesive layer 30 at the first area 320 would deform. The thickness of the first optical clear adhesive layer 30 is small, the recovery of deformation is faster. The thickness of the first optical clear adhesive layer 30 is larger, the viscosity is better, and the layers adhered thereon are not easily detached. The first part 32 of the first optical clear adhesive layer 30 is corresponding to the first area 320, and the second part 34 is corresponding to the areas outside of the first area 320. The thickness of the first part 32 is smaller than the thickness of the second part 34. The thickness of the first part 32 is smaller, the recovery of deformation is faster, which is satisfying the demand of folding the flexible display apparatus 100. The thickness of the second part 34 is larger, the viscosity is better. The affect of folding deformation to the second part 34 is small, and the viscosity is enough to fasten firmly the polarizer 40 and the touch panel 20. In this embodiment, the touch panel 20 is disposed on the displaying plane of the display panel 10, and the touch panel 20 is adhered to the display panel 10 with the first optical clear adhesive layer 30.

Corresponding to the first area 320 is the deformed area of the flexible display apparatus 100 affected by folding when the flexible display apparatus 100 being operated from one of the spreading state and the folding state to another. The first part 32 of the first optical clear adhesive layer 30 is corresponding to the position of the first area 320 of the flexible display apparatus 100. The thickness of the first part 32 is smaller to prevent from accumulation of stress when the flexible display apparatus 100 being operated from one of the spreading state and the folding state to another. The recovery of the deformation of the first part 32 would be fast and satisfy the demand for folding of the flexible display apparatus 100. The affect of folding deformation to the second part 34 is small, so the thickness of the second part 34 is larger to satisfy the demand for adhering to adhere devices firmly and avoid of bubbles occurring, and thereby favorable for realizing the flexible display apparatus.

In this embodiment, the directions of the transparent spacers 300 are same as the extending direction of the midline 60. In one embodiment, the flexible display apparatus 100 is folded along the midline 60. The distributing directions of the transparent spacers 300 same as the extending direction of the midline 60 means the directions of the transparent spacers 300 are parallel to the edges of the first area 320. The area between a pair of the transparent spacers 300 covers the first area 320, thereby the first part 32 of the first optical clear adhesive layer 30 covers totally the first area 320, and the distances between the transparent spacer 300 and the edge of the first area 320 are same. Further, the distributing directions of the transparent spacers 300 are same as the extending direction of the midline 60. The transparent spacers 300 are parallel to the midline 60 of the flexible display apparatus 100. The transparent spacers 300 would not affect the folding of the first area 320, thereby to promote the folding effect.

Please refer to FIG. 5, in this embodiment, the flexible display apparatus 100 further comprises a cover 50. The cover 50 is disposed on one side of the touch panel 20 far away the display panel 10. The cover 50 is adhered to the touch panel 20 with an optical clear adhesive 42, for protecting the touch panel 20, the display panel 10, etc. In this embodiment, the cover 50 is a flexible transparent cover 50, such as plastic material. The cover 50 has the feature of being flexible.

Figure 6:
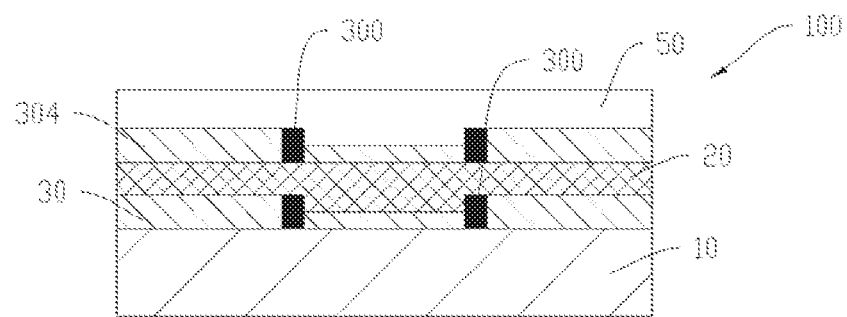
FIG. 6 is a structural schematic view of a flexible display apparatus according to a fourth embodiment of the disclosure.

Please refer to FIG. 6, the difference between the flexible display apparatus 100 provided in the fourth embodiment of the present invention and the flexible display apparatus in the first embodiment is a third optical clear adhesive layer 304 disposed between the cover 50 and the touch panel 20.

The cover 50 is adhered to the touch panel 20 with the third optical clear adhesive layer 304. In specific, the first optical clear adhesive layer 30 is same as the third optical clear adhesive layer 304. In other words, the third optical clear adhesive layer 304 between the cover 50 and the touch panel 20 is also divided by a pair of the transparent spacers 300 into a first part 32 and a second part 34. The thickness of the first part 32 is smaller than the thickness of the second part 34. In this embodiment, the first part 32 between the cover 50 and the touch panel 20 is corresponding to the first part 32 between the touch panel 20 and the display panel 10. Also referring to FIG. 2, corresponding to the first area 320 is the deformed area of the flexible display apparatus 100 affected by folding when the flexible display apparatus 100 being operated from one of the spreading state and the folding state to another. The first part 32 of the third optical clear adhesive layer 304 is corresponding to the position of the first area 320 of the flexible display apparatus 100. The thickness of the first part 32 is smaller to prevent from accumulation of stress when the flexible display apparatus 100 being operated from one of the spreading state and the folding state to another. The recovery of the deformation of the first part 32 would be fast and satisfy the demand for folding of the flexible display apparatus 100. The affect of folding deformation to the second part 34 is small, so the thickness of the second part 34 is larger to satisfy the demand for adhering to adhere devices firmly and avoid of bubbles occurring, and thereby favorable for realizing the flexible display apparatus.

Figure 7:
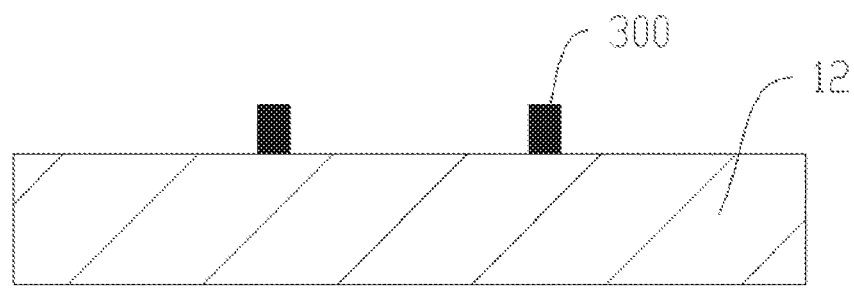
FIG. 7 is a structural schematic view illustrating the step S101 of the method for fabricating a flexible display apparatus according to an embodiment of the disclosure.
Figure 8:
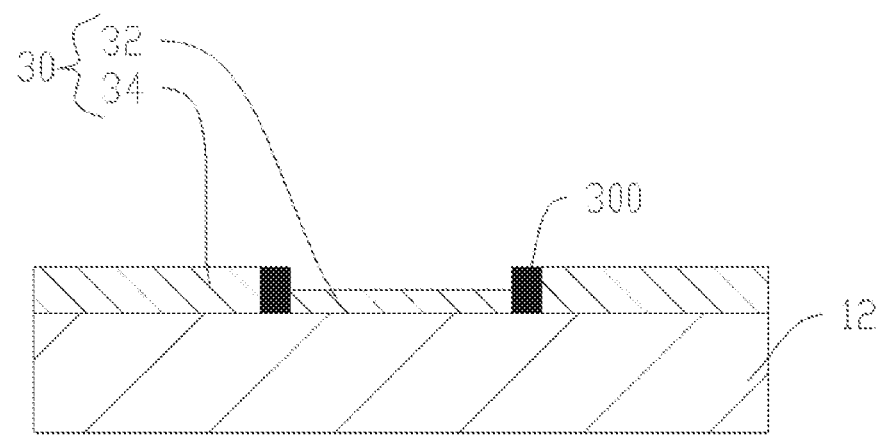
FIG. 8 is a structural schematic view illustrating the step S102 of the method for fabricating a flexible display apparatus according to an embodiment of the disclosure.
Figure 9:
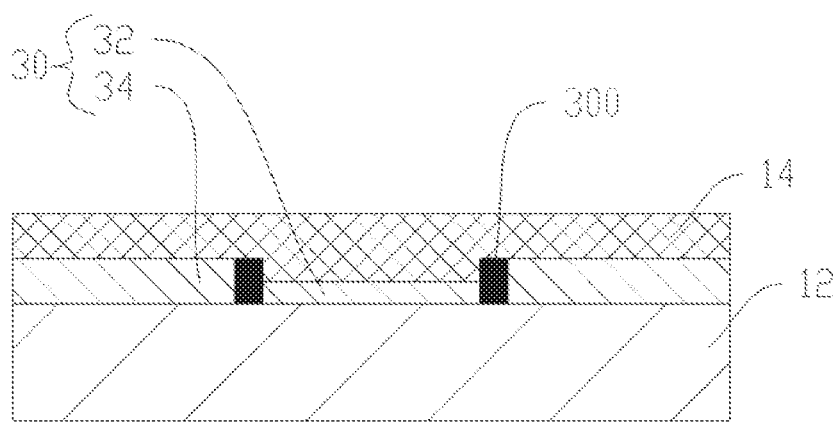
FIG. 9 is a structural schematic view illustrating the step S103 of the method for fabricating a flexible display apparatus according to an embodiment of the disclosure.

Please refer to FIG. 7 to FIG. 9, the present invention also provides a method for fabricating the flexible display apparatus 100. The method comprises the following steps.

Step S101 is providing a first substrate 12, and forming a pair of transparent spacers 300 on the first substrate 12.

Please refer to FIG. 7, in this embodiment, the first substrate 12 may be chosen from a group of the display panel 10, the touch panel 20, the polarizer 40, etc. In one embodiment, the transparent spacers 300 are formed of non-conductive transparent material. The transparent spacers 300 would not affect the displaying of the display panel 10, and the insulating spacers would not affect the touching function of the touch panel 20. In one embodiment, the transparent spacers 300 is formed by an inkjet printing process. The thickness of the transparent spacers 300 is about 3~20 μm. In one embodiment, the pair of the transparent spacers is disposed vertically on the first substrate 12.

Step S102 is spraying liquid optical clear adhesive on the first substrate to form a first optical clear adhesive layer 30. The transparent spacers 300 are applied to divide the first optical clear adhesive layer 30 into the first part 32 and the second part 34. The first part 32 is located between the pair of the transparent spacers 300, and the second part 34 is located at outside of the pair of the transparent spacers 300. The thickness of the first part 32 is smaller than the thickness of the second part 34. The vertical projection of the first part 32 on the first substrate 12 is forming the first area 320. When the flexible display apparatus 100 is in a folding state, the first area 320 is bent.

Please refer to FIG. 8 and FIG. 2, the first area 320 of the flexible display apparatus 100 is located between a pair of the transparent spacers 300. Further, the area formed between a pair of the transparent spacers 300 covers at least the first area 320. When the flexible display apparatus 100 has an even thickness, the first area 320 is distributed symmetrically along the midline 60. A pair of the transparent spacers 300 is disposed symmetrically at two sides of the midline 60. In one embodiment, the transparent spacers 300 are formed of non-conductive transparent materials. The transparent spacers 300 would not affect the displaying of the display panel 10, and the insulating spacers would not affect the touching function of the touch panel 20. In this embodiment, the transparent spacers 300 are applied to divide the first optical clear adhesive layer 30 into the first part 32 and the second part 34. The first part 32 is located between a pair of the transparent spacers 300, namely the first part 32 covers at least the first area 320. The second part 34 is located at outside of a pair of the transparent spacers 300. In specific, the second part 34 is distributed from the transparent spacer 300 to the edge of the flexible display apparatus 100. In this embodiment, the thickness of the first part 32 is smaller than the thickness of the second part 34. In other words, the thickness of the first optical clear adhesive layer 30 corresponding to the first area 320 is smaller than the thickness of the first optical clear adhesive layer 30 distributed at outside of the first area 320. When the flexible display apparatus 100 is folded, the first optical clear adhesive layer 30 at the first area 320 would deform. The thickness of the first optical clear adhesive layer 30 is small, the recovery of deformation is faster. The thickness of the first optical clear adhesive layer 30 is larger, the viscosity is better, and the layers adhered thereon are not easily detached. The first part 32 of the first optical clear adhesive layer 30 is corresponding to the first area 320, and the second part 34 is corresponding to the areas outside of the first area 320. The thickness of the first part 32 is smaller than the thickness of the second part 34. The thickness of the first part 32 is smaller, the recovery of deformation is faster, which is satisfying the demand of folding the flexible display apparatus 100. The thickness of the second part 34 is larger, the viscosity is better. The affect of folding deformation to the second part 34 is small, and the viscosity is enough to fasten firmly the polarizer 40 and the touch panel 20.

In one embodiment, the liquid optical clear adhesive is sprayed on the first substrate 12 by an inkjet printing process. The spraying process is easy to perform and has high positional accuracy.

Step S103 is adhering a second substrate 14 to the first substrate 12 with the first optical clear adhesive layer 30.

Please refer to FIG. 9, in this embodiment, the second substrate 14 may be chosen from a group of the touch panel 20, the polarizer 40, the cover 50, etc.

Corresponding to the first area 320 is the deformed area of the flexible display apparatus 100 affected by folding when the flexible display apparatus 100 being operated from one of the spreading state and the folding state to another. The first part 32 of the first optical clear adhesive layer 30 is corresponding to the position of the first area 320 of the flexible display apparatus 100. The thickness of the first part 32 is smaller to prevent from accumulation of stress when the flexible display apparatus 100 being operated from one of the spreading state and the folding state to another. The recovery of the deformation of the first part 32 would be fast and satisfy the demand for folding of the flexible display apparatus 100. The affect of folding deformation to the second part 34 is small, so the thickness of the second part 34 is larger to satisfy the demand for adhering to adhere devices firmly and avoid of bubbles occurring, and thereby favorable for realizing the flexible display apparatus.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. A flexible display apparatus, comprising:
   a first substrate;
   a first optical clear adhesive layer, disposed on one side of the first substrate, wherein the first optical clear adhesive layer has a pair of transparent spacers, the transparent spacers are applied to divide the first optical clear adhesive layer into a first part and a second part, the first part is located between the pair of the transparent spacers, the second part is located at outside of the pair of the transparent spacers, a thickness of the first part is smaller than a thickness of the second part, a vertical projection of the first part on the first substrate is forming a first area, when the flexible display apparatus is in a folding state, the first area is bent; and
   a second substrate and a polarizer, wherein the second substrate is disposed between the first substrate and the first optical clear adhesive layer, the polarizer is disposed on one side of the first optical clear adhesive layer away from the second substrate, the polarizer is adhered to the second substrate with the first optical clear adhesive layer.

2. The flexible display apparatus according to claim 1, wherein the transparent spacers are disposed in a same direction.

3. The flexible display apparatus according to claim 1, wherein the pair of the transparent spacers is disposed vertically on the first substrate.

4. The flexible display apparatus according to claim 2, wherein a midline of the two second parts is through the first area, and the pair of the transparent spacers is disposed symmetrically at two sides of the midline.

5. The flexible display apparatus according to claim 4, further comprising:
   a cover, disposed on one side of the polarizer away from the second substrate, and
   a third optical clear adhesive layer, disposed between the cover and the second substrate, the cover adhered to the second substrate with the third optical clear adhesive layer.

6. The flexible display apparatus according to claim 3, wherein a midline of the two second parts is through the first area, and the pair of the transparent spacers is disposed symmetrically at two sides of the midline.

7. The flexible display apparatus according to claim 6, further comprising:
   a cover, disposed on one side of the polarizer away from the second substrate, and
   a third optical clear adhesive layer, disposed between the cover and the second substrate, the cover adhered to the second substrate with the third optical clear adhesive layer.

* * * * *